(12) United States Patent
Ohtera et al.

(10) Patent No.: US 7,888,846 B2
(45) Date of Patent: Feb. 15, 2011

(54) ACTUATOR

(75) Inventors: Shozo Ohtera, Otsu (JP); Yoshiaki Kohono, Moriyama (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 12/821,473

(22) Filed: Jun. 23, 2010

(65) Prior Publication Data

US 2010/0253180 A1 Oct. 7, 2010

Related U.S. Application Data

(63) Continuation of application No. PCT/JP2008/070101, filed on Nov. 5, 2008.

(30) Foreign Application Priority Data

Dec. 27, 2007 (JP) ............... 2007-337365
Sep. 18, 2008 (JP) ............... 2008-239642

(51) Int. Cl.
*H02N 2/02* (2006.01)
*H02N 2/04* (2006.01)
*H02K 41/03* (2006.01)
*A61F 2/62* (2006.01)

(52) U.S. Cl. .............. 310/330; 310/311; 310/328; 623/24; 60/516

(58) Field of Classification Search .......... 623/24, 623/3.11; 318/115–118; 60/527–529; 310/311, 310/328, 330–331
See application file for complete search history.

(56) References Cited

U.S. PATENT DOCUMENTS

| 4,019,073 | A | * | 4/1977 | Vishnevsky et al. | ......... 310/322 |
| 5,589,725 | A | * | 12/1996 | Haertling | ................ 310/358 |
| 6,093,995 | A | * | 7/2000 | Lazarus et al. | ............ 310/328 |
| 6,810,163 | B2 | | 10/2004 | Saito | |
| 7,528,527 | B2 | * | 5/2009 | Yamamoto | ................ 310/328 |

FOREIGN PATENT DOCUMENTS

| JP | 8182352 | A | 7/1996 |
| JP | 2002-333584 | A | 11/2002 |
| JP | 2007-181384 | A | 7/2007 |
| JP | 2007-274788 | A | 10/2007 |
| JP | 2007-318887 | A | 12/2007 |
| JP | 2070274 | A | 3/2009 |

* cited by examiner

*Primary Examiner*—Burton Mullins
(74) *Attorney, Agent, or Firm*—Dickstein Shapiro LLP

(57) ABSTRACT

When an actuator is driven, a stationary element continuously generates a pressing force for spreading in a radial direction such that the stationary element is relatively retracted into movable elements positioned at both ends of the stationary element. As a result, a distance between the movable elements adjacent to each other is reduced, and a contracting operation is performed. When the actuator is not driven, only a relatively low frictional force is generated between the moving elements and the stationary element. Hence, the movable elements and the stationary element can change relative position by small external force.

17 Claims, 12 Drawing Sheets

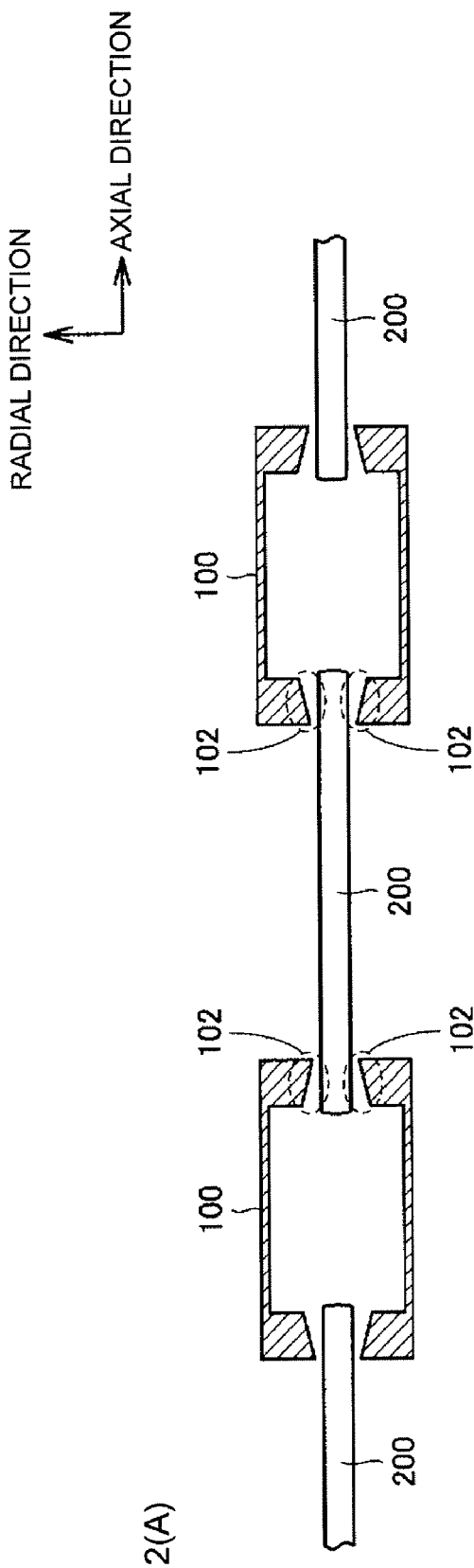

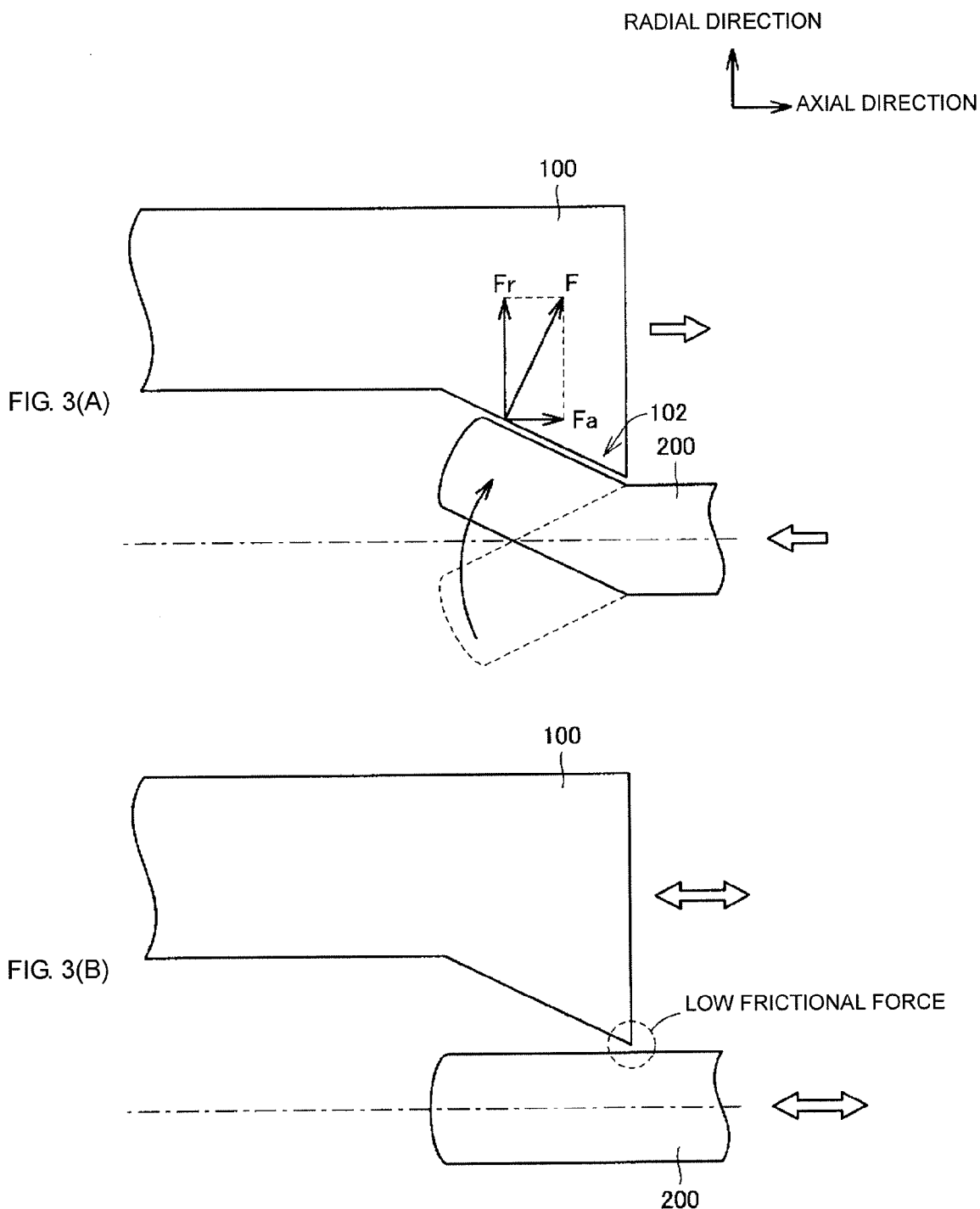

FIG. 10
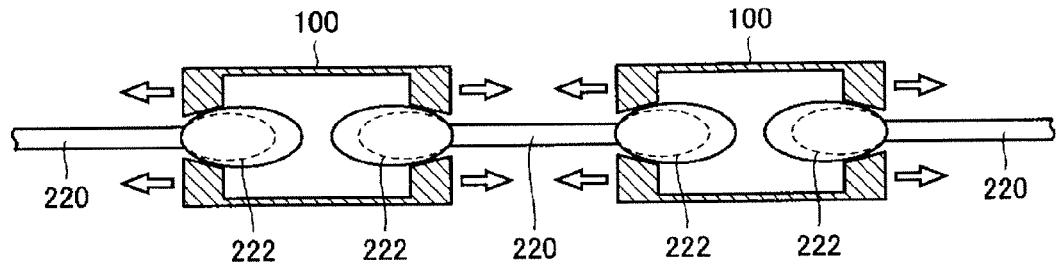
FIG. 11(A)  MEMORIZED SHAPE: LINEAR
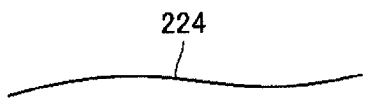
FIG. 11(B)
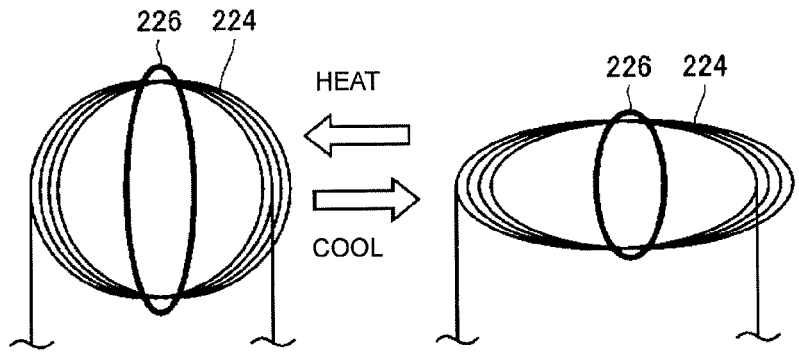
FIG. 11(C)
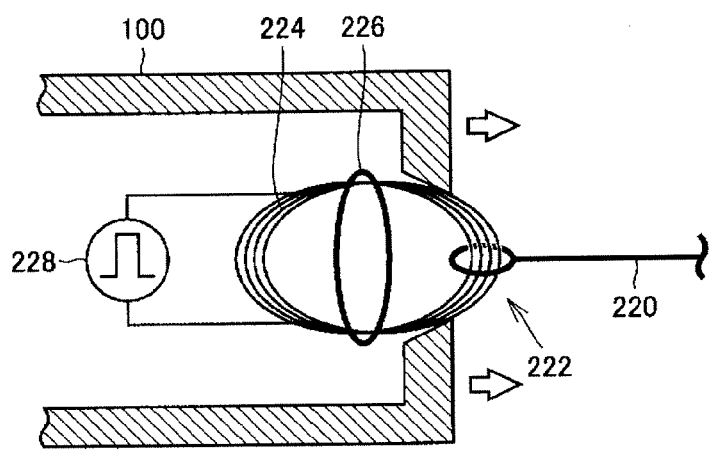

TENSILE STATE (AT ROOM TEMPERATURE)

MEMORIZED SHAPE (UNDER HEATING)

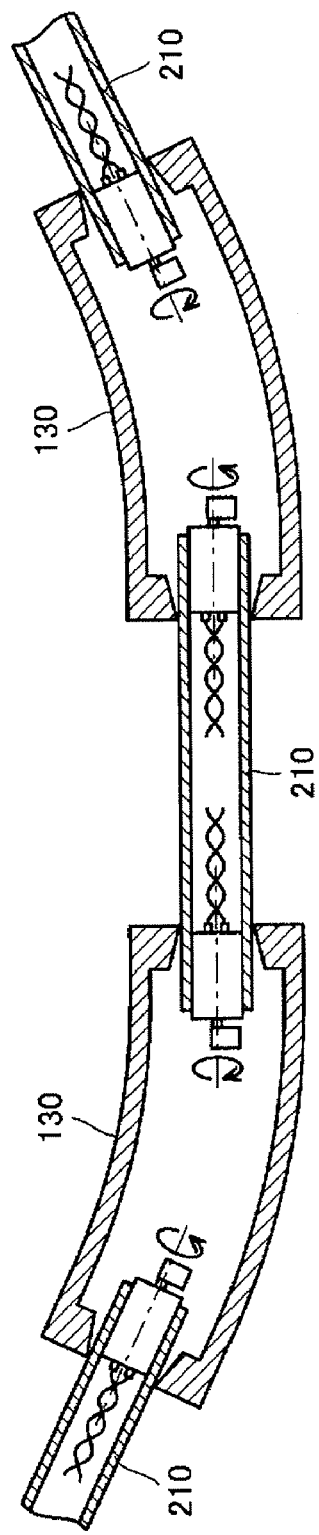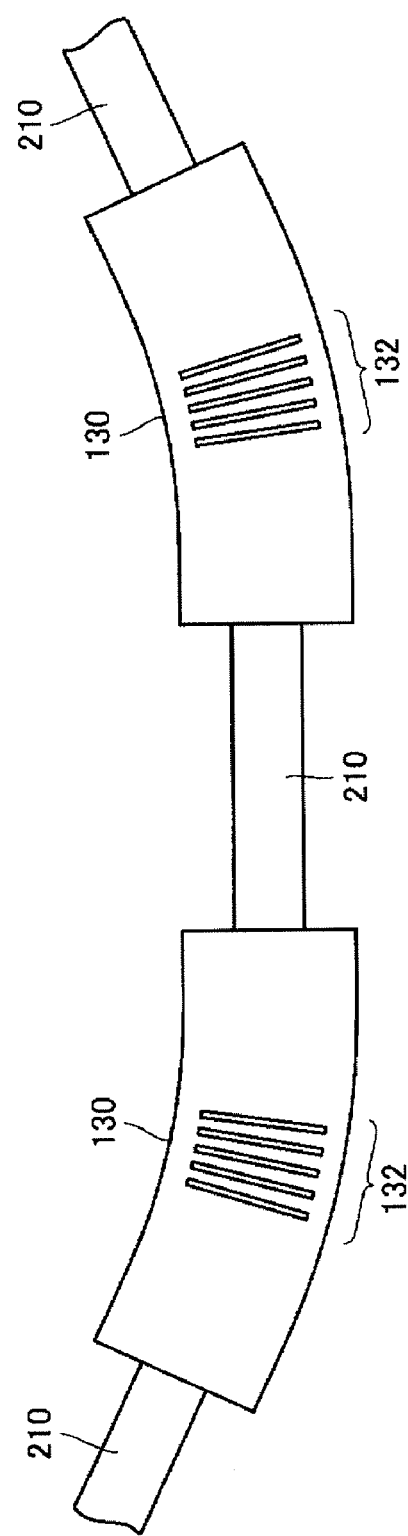
FIG. 17(A)
FIG. 17(B)

ACTUATOR

CROSS REFERENCE TO RELATED APPLICATIONS

The present application is a continuation of International Application No. PCT/JP2008/070101, filed Nov. 5, 2008, which claims priority to Japanese Patent Application No. JP2007-3373365, filed Dec. 27, 2007, and Japanese Patent Application No. JP2008-239642, filed Sep. 18, 2008, the entire contents of each of these applications being incorporated herein by reference in their entirety.

FIELD OF THE INVENTION

The present invention relates to an actuator capable of extending and contracting along a predetermined axis of movement, and more particularly to a construction capable of reducing a static force when the actuator is not driven.

BACKGROUND OF THE INVENTION

Hitherto, various types of actuators (driving devices) have been developed depending on applications. Attention has recently been focused on an artificial actuator taking into account the mechanism of muscles of an organism, which is generally called an "artificial muscle".

In an actual organism, an articulation or the like is formed by a pair of a muscle called "agonist" and a muscle called "antagonist". For example, when the articulation is moved, one muscle is contracted while the other muscle is maintained in the relaxed state. Because the other muscle in the relaxed state can change its extended or contracted state by a small force, an amount of work generated by the contraction of the one muscle can be substantially all used to move the relevant articulation (i.e., to perform external work). If the other muscle is not maintained in the relaxed state and a large force is required to extend the other muscle, the amount of work generated by the contraction of the one muscle is consumed in its large part for work to extend the other muscle, and work efficiency is reduced. Accordingly, it is preferable for the actuator, which is to be used as the artificial muscle, that when the actuator is not driven, a relative positional relation of the actuator can be freely changed by a small force, namely a static force is as small as possible.

As a known actuator capable of extending and contracting along a predetermined axis of movement, there is disclosed an arrangement in which two members are contacted with each other and traveling waves are applied to a contact surface between the two members by utilizing ultrasonic waves, thus causing the two members to move relatively (see, e.g., Japanese Unexamined Patent Application Publication No. 8-182352 (Patent Document 1), Japanese Unexamined Utility Model Registration Application Publication No. 2-129193 (Patent Document 2), and Japanese Unexamined Patent Application Publication No. 2-070274 (Patent Document 3), etc.). Also, Japanese Unexamined Patent Application Publication No. 2007-181384 (Patent Document 4) discloses an arrangement in which a displacement is generated by applying asymmetrical motions to a shaft so as to provide frictional forces asymmetrical to each other.

Patent Document 1: Japanese Unexamined Patent Application Publication No. 8-182352

Patent Document 2: Japanese Unexamined Utility Model Registration Application Publication No. 2-129193

Patent Document 3: Japanese Unexamined Patent Application Publication No. 2-070274

Patent Document 4: Japanese Unexamined Patent Application Publication No. 2007-181384

With any of the arrangements disclosed in the prior-art documents mentioned above, however, because a frictional force is basically utilized as a primary driving source, a static frictional force acting upon the contact surface between the two members needs to be comparatively large. Thus, because a comparatively large driving force is required to move the two members relative to each other, it has been impossible in principle to realize the above-described relaxed state of the muscle. Further, when the actuator is driven, a relatively large driving force needs to be generated against the static frictional force, and the comparatively large driving force necessarily causes a wear between the two members. This results in another problem that the life span of the actuator itself cannot be prolonged.

SUMMARY OF THE INVENTION

The present invention has been accomplished with a view of solving the above-described problems, and an object of the present invention is to provide an actuator suitable for an artificial muscle.

According to one aspect of the present invention, there is provided an actuator including a stationary element and a movable element. The stationary element and the movable element are relatively movable along a predetermined axis of movement when the actuator is not driven. The stationary element includes a displaceable portion causing a displacement at least in a radial direction when the actuator is driven. The movable element includes a pressure bearing portion imposing an acting force in one direction along the axis of movement in response to the displacement caused by the displaceable portion of the stationary element. The acting force generated by the pressure bearing portion when driven is larger than a force required for moving the stationary element and the movable element relative to each other when not driven.

Preferably, the pressure bearing portion is constituted to generate a component force in the one direction along the axis of movement by receiving pressure in the radial direction, which is generated due to the displacement caused by the displaceable portion.

Preferably, the pressure bearing portion has a surface which is positioned away from the axis of movement by a predetermined distance, and a distance between the axis of movement and the surface of the pressure bearing portion in a direction perpendicular to the axis of movement gradually increases or decreases along an axial direction.

Preferably, a predetermined clearance is left between the stationary element and the movable element.

As an alternative, preferably, a support member for providing any of point contact and line contact is disposed between the stationary element and the movable element.

Preferably, the displaceable portion includes, as a source for generating the displacement, a strainable member which generates strain based on at least one of a piezoelectric effect, an electrostrictive effect, a magnetostriction effect, and a Maxwell force upon application of a voltage when the actuator is driven.

As an alternative, preferably, the displaceable portion includes a rotating member which is rotated with electric power supplied when the actuator is driven, and an eccentric coupled to the rotating member in eccentric relation to a rotary shaft of the rotating member. The displacement is caused due to a deformation developed by an eccentric force that is generated with the rotation of the rotating member.

As an alternative, preferably, the displaceable portion includes a shape changeable member changing a shape thereof at least in the radial direction through martensitic transformation, and a temperature change generator for giving the shape changeable member with a temperature change crossing a transformation point of the shape changeable member.

As an alternative, preferably, the displaceable portion includes an expanding and contracting portion capable of changing an outer shape thereof at least in the radial direction depending on an internal pressure, a medium enclosed in the expanding and contracting portion and changing a volume thereof due to phase transition, and a temperature change generator for giving the medium with a temperature change crossing a transition point of the medium.

Preferably, the movable element is constituted to be flexible.

Preferably, at least one of the stationary element and the movable element further includes a restriction portion for restricting relative movement between the stationary element and the movable element.

According to another aspect of the present invention, there is provided an actuator including a stationary element and a movable element. The stationary element and the movable element are relatively movable along a predetermined axis of movement when the actuator is not driven. The movable element includes a displaceable portion causing a displacement at least in a radial direction when the actuator is driven. The stationary element includes a pressure bearing portion imposing an acting force in one direction along the axis of movement in response to the displacement caused by the displaceable portion of the movable element. The acting force generated by the pressure bearing portion when driven is larger than a force required for moving the stationary element and the movable element relative to each other when not driven.

Preferably, the actuator further includes a variation generator for cyclically varying voltage or temperature change applied to a displaceable member of the displaceable portion.

With the present invention, the actuator suitable for the artificial muscle can be realized.

BRIEF DESCRIPTION OF THE DRAWINGS

FIGS. 2(A) and 2(B) are sectional views illustrating primary part of an actuator according to Embodiment 1 of the present invention.

FIGS. 3(A) and 3(B) are explanatory views to explain the principle of operation of the actuator according to Embodiment 1 of the present invention.

FIG. 10 is a schematic view illustrating the structure of an actuator according to Embodiment 3 of the present invention.

FIGS. 11(A) to 11(C) are explanatory views to explain primary part of the actuator according to Embodiment 3 of the present invention.

FIGS. 17(A) and 17(B) illustrate one example of an arrangement in which basic units of an actuator according to Embodiment 6 of the present invention are connected in series.

Figure 1A:
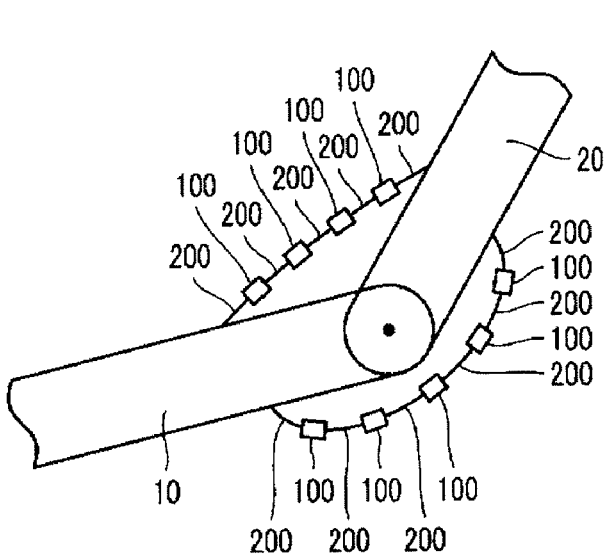
FIGS. 1(A) to 1(C) illustrate one example of a mechanism to which an actuator according to the present invention is applied.

REFERENCE NUMERALS 1 mechanism, 10, 20 members, 102, 404 pressure bearing portion, 100, 110, 120, 130, 140, 300 movable elements, 112 clearance, 122 projection, 132 slit, 200, 200A, 210, 220, 240, 250, 260, 270, 290, 402 stationary elements, 202 shim member, 204a piezoelectric member, 206a surface electrode, 208 AC voltage source, 212, 302 rotating members, 214 rotary shaft, 216, 304 eccentrics, 218 wiring, 222 displaceable portion, 224 shape-memory alloy fiber, 226 ring member, 228 current source, 230 spring member, 234 displaceable portion, 242 expanding and contracting portion, 244 heater unit, 246 power supply unit, 248 medium, 252 core portion, 254a, 254b, 258a, 258b, 258c, 258d electrodes, 256 clad portion, 259 DC voltage source, 262, 272a, 276a deformable layers, 264a, 264b movable portions, 266a, 266b, 274, 278 restraint layers, 272b, 272c, 276b, 276c electrodes, 280 spacer, 292, 294 stopper portion, and SW switch unit.

DETAILED DESCRIPTION OF THE INVENTION

Embodiments of the present invention will be described in detail with reference to the drawings. Be it noted that the same or equivalent components in the drawings are denoted by the same reference characters and descriptions of those components are not repeated.

The present invention is to provide an actuator capable of realizing behaviors similar to operations of muscles of an organism. The muscle of the organism has a basic structure including actins and myosins each interconnecting the actins.

When the muscle is tensed, the myosin slides (glides) into the actin such that the distance between the actins is reduced, to thereby realize a contracting operation. On the other hand, when the muscle is relaxed, the actin and the myosin come into a very loosely coupled state such that the myosin can freely change a relative relation to the actin by a small external force. Thus, the muscle of the organism is contracted in one direction under the tensed state, while it is freely extended or contracted by receiving an external force under the relaxed state.

Referring to FIG. 1(A), a mechanism 1 typically includes two members 10 and 20 linked to each other. The two members 10 and 20 are capable of relatively rotating about a linked point. Further, the member 10 and the member 20 are interconnected by plural basic units of actuators according to the present invention, which are arranged in series on each of the upper and lower sides of those members as viewed on the drawing sheet. The actuator according to the present invention includes, as a basic structure, a movable element (rotor) 100 and a stationary element (stator) 200. A plurality of movable elements 100 and a plurality of stationary elements 200 are alternately coupled to realize contracting/relaxing motions as a whole.

Figure 1B:
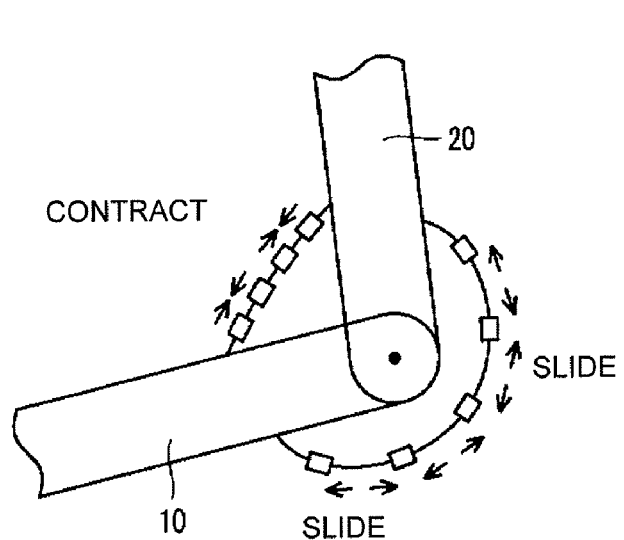

As illustrated in FIG. 1(B), when the member 20 is rotated relative to the member 10 upward as viewed on the drawing sheet, the actuator arranged on the upper side as viewed on the drawing sheet performs a "contracting" operation, while the actuator arranged on the lower side as viewed on the drawing sheet performs a "sliding" operation.

Figure 1C:
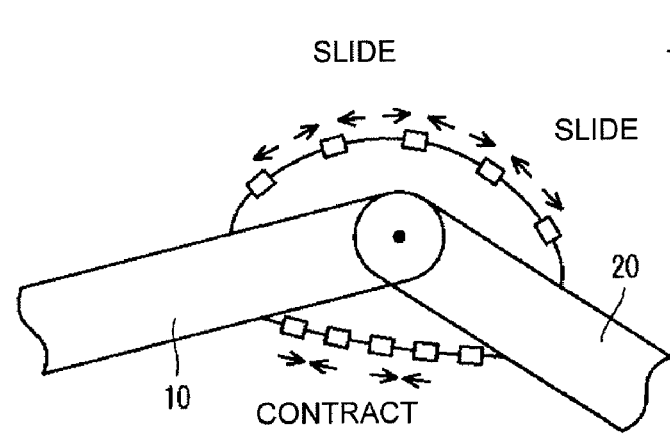

As illustrated in FIG. 1(C), when the member 20 is rotated relative to the member 10 downward as viewed on the drawing sheet, the actuator arranged on the lower side as viewed on the drawing sheet performs the "contracting" operation, while the actuator arranged on the upper side as viewed on the drawing sheet performs the "sliding" operation.

In the "contracting" operation, as described later in detail, the stationary elements 200 cause displacements to generate stresses acting upon the movable elements 100 such that the movable elements 100 and the stationary elements 200 are relatively moved in one predetermined direction by the stresses. Also, in the "sliding" operation, as described later in detail, the movable elements 100 and the stationary elements 200 are relatively moved by a force applied from the exterior in a state where frictional forces between the movable elements 100 and the stationary elements 200 are maintained at a comparatively small value. In the actuator performing the "sliding" operation, therefore, an amount of work required for the contraction or the extension is very small. As a result, in the case of FIG. 1(B), the amount of work generated by the actuator, which is arranged on the upper side as viewed on the drawing sheet, is substantially all utilized to perform the relative movement between the member 10 and the member 20, whereby higher work efficiency can be realized. That point is similarly applied to the case of FIG. 1(C).

Further, rigidity of the mechanism 1 can be increased with the "contracting" operations of two actuators arranged respectively on the upper and lower sides as viewed on the drawing sheet. In other words, when each of the two actuators performs the "contracting" operation, the relative position between the member 10 and the member 20 can also be held fixed.

As described above, a mechanism or a device having a high degree of freedom can be realized by using, in pair, one actuator corresponding to the agonist and the other actuator corresponding to the antagonist as in the articulation of the actual organism.

Embodiment 1

Overall Construction

FIGS. 2(A) and 2(B) are sectional views illustrating primary part of an actuator according to Embodiment 1 of the present invention. Specifically, FIG. 2(A) illustrates an extended state, and FIG. 2(B) illustrates a contracted state.

Referring to FIGS. 2(A) and 2(B), the actuator according to this embodiment includes a hollow movable element (rotor) 100 and a rod-shaped stationary element (stator) 200. The movable element 100 and the stationary element 200 are constructed such that they are arranged along a common axis and are relatively movable along a predetermined axis of movement. More specifically, the rod-shaped stationary element 200 is relatively retracted into the movable elements 100 which are positioned at both ends of the stationary element 200. As a result, a distance between the adjacent movable elements 100 is reduced, and the contracting operation is performed. Each of the movable element 100 and the stationary element 200 may have a columnar shape having a circular cross-section or a polygonal columnar shape having a polygonal cross-section. The following description is made, for the sake of convenience in explanation, in connection with the case where each of the movable element 100 and the stationary element 200 has a columnar shape.

In this Description, the term "movable element" or "rotor" is used in consideration of that the distance of two movable elements adjacent to each other varies when the actuator is observed in its outer appearance. The term "stationary element" or "stator" is used in consideration of that the stationary element does not move in itself when the actuator is observed in its outer appearance. Be it noted, however, that those expressions are used merely for the sake of convenience in explanation and the meanings of the terms are not restricted by their expressions.

As illustrated in FIG. 2(A), holes allowing the stationary elements 200 to penetrate therethrough are formed at both the ends of the movable element 100 substantially about a center axis thereof such that the stationary elements 200 can freely slide (glide). In the following description, a direction along respective center axes of the movable element 100 and the stationary element 200 is also called an "axial direction", and a direction perpendicular to the axial direction is also called a "radial" direction.

Around each of the holes of the movable element 100, a pressure bearing portion 102 is formed such that its size in the radial direction (i.e., its radius) is uneven along the axial direction. As illustrated in FIG. 2(B), when the actuator is driven, the stationary element 200 causes a displacement (deformation) at least in the radial direction. In response to the displacement of the stationary element 200 in the radial direction, the pressure bearing portion 102 imposes an acting force upon the movable element 100 and the stationary element 200 so as to relatively move both the elements along the axial direction in a predetermined orientation (i.e., an orientation in which the movable elements 100 come closer to each other).

More specifically, when the actuator is driven, the stationary element 200 continuously generates a force acting to radially press and spread both the ends thereof, and hence the stationary element 200 is relatively retracted into the movable elements 100 positioned at both the ends of the stationary element 200. As a result, the distance between the adjacent movable elements 100 is reduced, and the contracting operation is performed. On the other hand, when the actuator is not driven, only a relatively low frictional force is generated between the movable element 100 and the stationary element 200, and hence both the elements can be moved relative to each other by receiving a slight force applied from the exterior.

(Principle of Operation)

FIGS. 3(A) and 3(B) are explanatory views to explain the principle of operation of the actuator according to Embodiment 1 of the present invention. Specifically, FIG. 3(A) illustrates the contracting operation when the actuator is driven, and FIG. 3(B) illustrates the sliding operation when the actuator is not driven.

Referring to FIG. 3(A), in the actuator according to this embodiment, when the actuator is driven, the stationary element 200 causes a displacement (deformation) at least in the radial direction, and the pressure bearing portion 102 of the movable element 100 receives stress F upon the displacement of the stationary element 200.

The movable element 100 has the pressure bearing portion 102 formed such that its size in the radial direction (i.e., its radius) is uneven along the axial direction. Typically, the pressure bearing portion 102 has a tapered shape about the axial direction and generates component forces (acting forces), which are asymmetric with respect to the axial direction, from the stress received from the stationary element 200. Stated another way, the pressure bearing portion 102 has a surface positioned away from the axis of movement by a predetermined distance, and the distance between the axis of movement and the surface of the pressure bearing portion 102 as viewed in a direction perpendicular to the axis of movement gradually increases or decreases along the axial direction. Because of having such a shape, the pressure bearing portion 102 according to this embodiment imposes a force Fa, which acts along the axial direction rightward as viewed on the drawing sheet, by receiving the stress F at the above-mentioned surface of the pressure bearing portion 102. The acting force Fa gives rise to a force causing the movable element 100 to move rightward as viewed on the drawing sheet and a force causing the stationary element 200 to move leftward as viewed on the drawing sheet.

The shape of the pressure bearing portion 102 is not limited to the tapered shape, and the pressure bearing portion 102 may have any suitable shape capable of generating the component forces (acting forces), which are asymmetric with respect to the axial direction, from the stress received from the stationary element 200.

Referring to FIG. 3(B), in the actuator according to this embodiment, when the actuator is not driven, the stationary element 200 maintains a shape extending in the axial direction. Therefore, the movable element 100 and the stationary element 200 contact each other at a part of the pressure bearing portion 102, but a resulting frictional force is relatively small. Accordingly, the relative relation between the movable element 100 and the stationary element 200 can be freely changed when the actuator is not driven.

As a result, the actuator according to this embodiment can realize the "sliding" operation to change the relative positional relation with a slight amount of work when not driven.

<Structure of Stationary Element>

The structure of the stationary element 200 according to this embodiment will be described below with reference to FIG. 4. One example of the stationary element 200 capable of applying the stress to the pressure bearing portion of the movable element 100 can be formed by using a strainable member that generates strain based on a piezoelectric effect, an electrostrictive effect, a magnetostriction effect, or a Maxwell force, for example, when a voltage is applied. In other words, the stationary element 200 made of strainable materials, including a piezoelectric material capable of deforming by an inverse piezoelectric action, can be used as a main constituent member of the displaceable portion.

Figure 4:
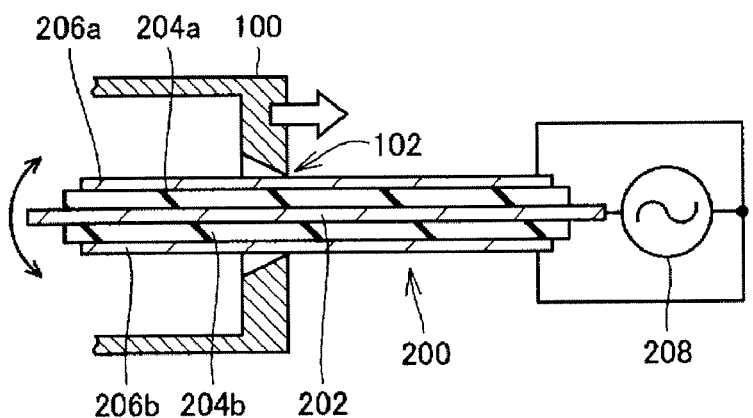
FIG. 4 is a schematic view illustrating the structure of a stationary element 200 according to Embodiment 1 of the present invention.

FIG. 4 is a schematic view illustrating the structure of the stationary element 200 according to Embodiment 1 of the present invention.

Referring to FIG. 4, the stationary element 200 according to this embodiment has the so-called bimorph structure and includes a shim member 202 having surfaces coated with an electrically conductive material, such as copper, piezoelectric members 204a and 204b each bonded to one of both sides of the shim member 202, and surface electrodes 206a and 206b formed on outer facing surfaces of the piezoelectric members 204a and 204b, respectively. The shim member 202 serves as an elasticity reinforcing member for orienting the entirety of the stationary element 200 to extend in the axial direction when the actuator is not driven.

When the actuator is driven, a predetermined AC voltage is applied between the shim member 202 and each of the surface electrodes 206a and 206b by an AC voltage source 208. Because electric fields symmetric with respect to the shim member 202 are applied to the piezoelectric members 204a and 204b, directions of internal electric fields generated in the piezoelectric members 204a and 204b are opposed to each other. Herein, the piezoelectric members 204a and 204b have such anisotropies that those members extend and contract in different (opposite) ways depending on the direction of the applied electric field. Therefore, when the above-mentioned AC voltage is applied to the piezoelectric members 204a and 204b, one of the piezoelectric members 204a and 204b is extended and the other is contracted. Thus, by applying the AC voltage from the AC voltage source 208, i.e., by switching the direction of the electric field applied to the piezoelectric members 204a and 204b per a predetermined time, the stationary element 200 is caused in its entirety to cyclically deform in the radial direction (i.e., in the up-and-down direction on the drawing sheet of FIG. 4).

In the driven state, with the above-described cyclic deformation of the stationary element 200, the pressure bearing portion 102 generates the acting force in the axial direction, whereby the contracting operation between the movable elements 100 is realized. On the other hand, in the not-driven state, because the stationary element 200 maintains the shape extending in the axial direction, the sliding operation can be realized.

Instead of the above-described bimorph structure, a unimorph structure using one layer of a piezoelectric member can also be employed. In that case, since the unimorph structure has a polygonal cross-sectional shape, elliptic or polygonal holes are preferably formed at both the ends of the movable element 100.

As another practice of the case using the bimorph structure, two piezoelectric fibers may be employed in pair. The piezoelectric fiber is manufactured by arranging a core portion made of a predetermined metallic material, forming a clad portion around the core portion by using a piezoelectric material, and forming electrodes on an outer surface of the clad portion by sputtering, for example. Further, two piezoelectric fibers thus manufactured may be bonded in pair to each other along the lengthwise direction thereof, thus providing the bimorph structure.

In the above-described bimorph structure including one pair of piezoelectric fibers, the piezoelectric fibers can be cyclically deformed in the radial direction by applying AC voltages, of which phases are opposite to each other, respectively to the piezoelectric fibers, i.e., between the core portions and the electrodes on the outer surfaces of the piezoelectric fibers. In that case, since the bimorph structure has an elliptic or polygonal cross-sectional shape, elliptic or polygonal holes are preferably formed at both the ends of the movable element 100.

Furthermore, the strain can also be taken out in a different form of displacement based on the piezoelectric effect, the electrostrictive effect, the magnetostriction effect, or the Maxwell force, for example, with application of voltage.

First Modification of Embodiment 1

Figure 5:
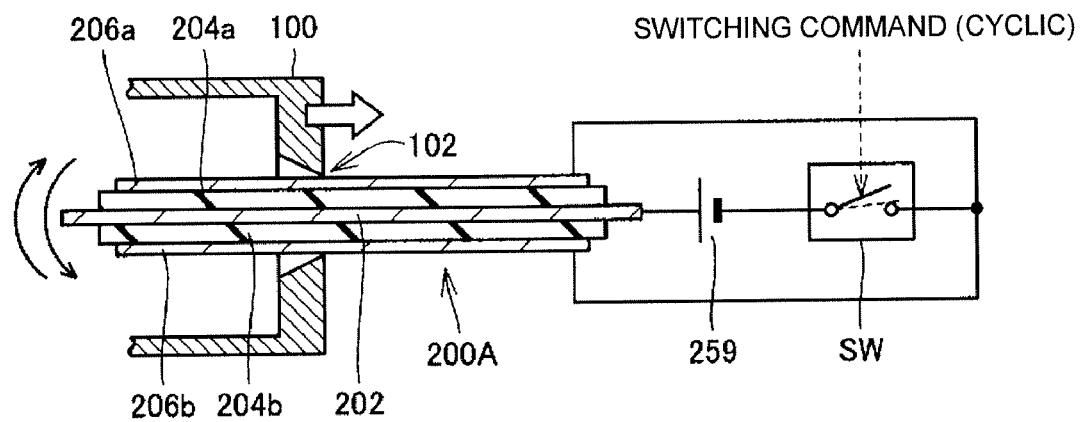
FIG. 5 is a schematic view illustrating the structure of a stationary element 200A according to a first modification of Embodiment 1 of the present invention.

FIG. 5 is a schematic view illustrating the structure of a stationary element 200A according to a first modification of Embodiment 1 of the present invention.

Referring to FIG. 5, in an actuator using the stationary element 200A according to this modification, the actuator is driven in a state where a current is varied by cyclically turning ON/OFF a voltage applied to the piezoelectric members 204a and 204b which are the strainable members. More specifically, in the actuator using the stationary element 200A, a DC voltage source 259 for generating a predetermined DC voltage and a switch unit SW are disposed, instead of the AC voltage source 208 (FIG. 4), between the shim member 202 and each of the surface electrodes 206a and 206b. In response to a cyclic switching command from a controller (not shown), the switch unit SW cyclically turns ON/OFF (intermittently supplies) the DC voltage that is applied to the piezoelectric members 204a and 204b from the DC voltage source 259.

When the switch unit SW is in an ON state, strains generate in the piezoelectric members 204a and 204b. On the other hand, when the switch unit SW is in an OFF state, no strains generate. With the switch unit SW cyclically repeating the ON and OFF states, therefore, the stationary element 200A is caused in its entirety to cyclically deform in the predetermined direction (i.e., in the up-and-down direction on the drawing sheet of FIG. 5). In other words, the stationary element 200A vibrates in its entirety in conformity with the ON/OFF cycle of the switch unit SW.

In the driven state, with the above-described cyclic deformation of the stationary element 200A, the pressure bearing portion 102 generates the acting force in the axial direction, whereby the contracting operation between the movable elements 100 is realized. On the other hand, in the not-driven state, because the stationary element 200A maintains the shape extending in the axial direction, the sliding operation can be realized.

Further, a large frictional force in excess of a design value may develop between the stationary element and the movable element for the reason that dirt, dust or the like enters between both the elements, or that contact surfaces of both the elements change with the lapse of time. Even in such a case, the dirt, the dust or the like can be removed by turning ON/OFF the switch unit SW at a proper cycle, and conditions of the contact surfaces of the stationary element and the movable element can be made stable by relatively moving the stationary element and the movable element to a position where the contact surfaces of both the elements have stable conditions. More stable conditions can also be realized by changing a mode in which the applied voltage is varied. For example, the amplitude of the applied voltage, the ON/OFF cycle of the switch unit SW, etc. may be changed as required depending on situations.

Additionally, a voltage applying circuit including the AC voltage source 208, illustrated in FIG. 4, and a voltage applying circuit including the DC voltage source 259 and the switch unit SW, illustrated in FIG. 5, may be connected in series so as to provide such an arrangement that the voltage can be optionally applied from any of those voltage applying circuits.

Second Modification of Embodiment 1

Figure 6A:
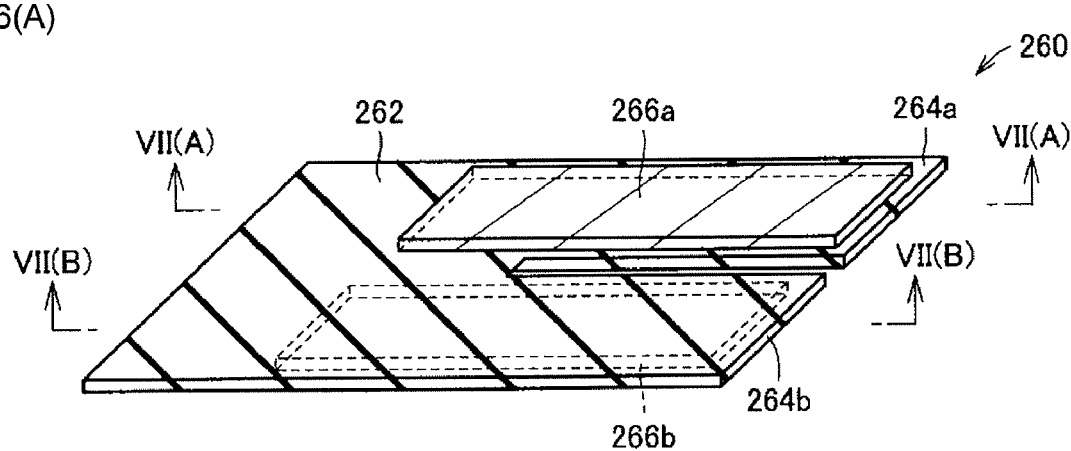
FIGS. 6(A) and 6(B) are schematic views illustrating the structure of a stationary element 260 according to a second modification of Embodiment 1 of the present invention.
Figure 6B:
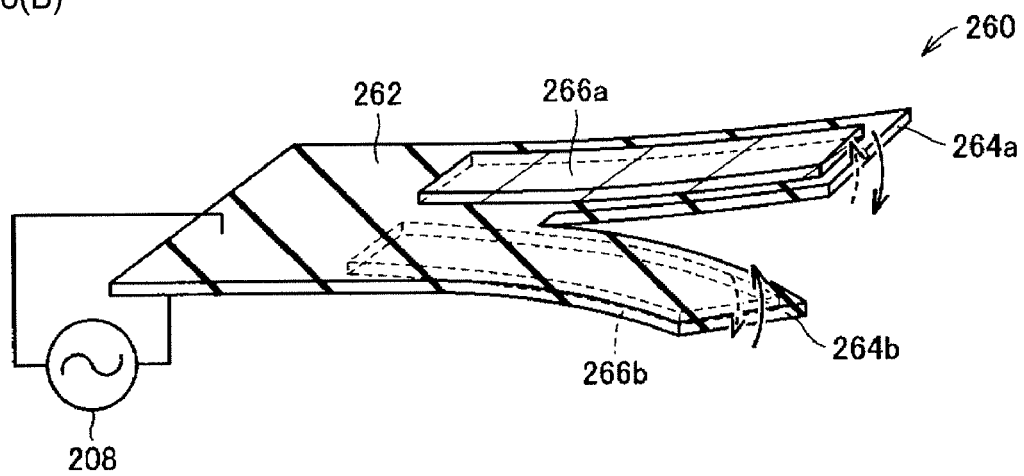
Figure 7A:
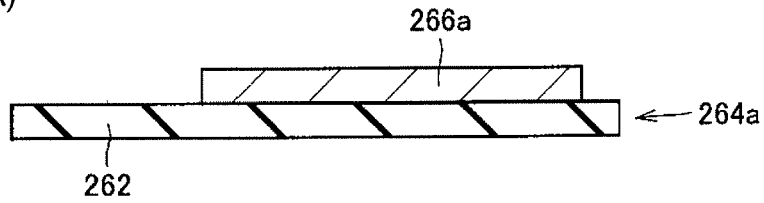
FIGS. 7(A) and 7(B) are schematic views illustrating the sectional structure of the stationary element 260 according to the second modification of Embodiment 1 of the present invention.
Figure 7B:
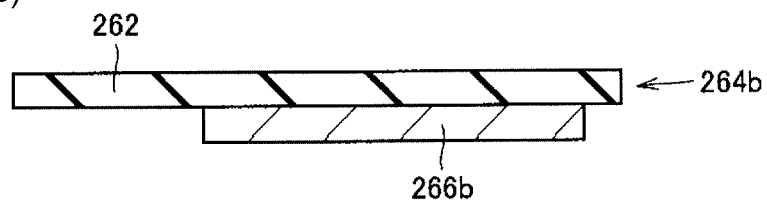

FIGS. 6(A) and 6(B) are schematic views illustrating the structure of a stationary element 260 according to a second modification of Embodiment 1 of the present invention. FIGS. 7(A) and 7(B) are schematic views illustrating the sectional structure of the stationary element 260 according to the second modification of Embodiment 1 of the present invention.

Referring to FIG. 6(A), the stationary element 260 according to this modification constitutes a slit-type unimorph actuator and includes a deformable layer 262 made of an electrostrictive polymer as a main constituent material. The deformable layer 262 may be formed by laminating a single layer made of the electrostrictive polymer in plural number one above another. The deformable layer 262 has a slit which is formed so as to extend from one side toward a central portion thereof. Two movable portions 264a and 264b having substantially the same surface area are formed on both sides of the slit. Restraint layers 266a and 266b each made of an electrostrictive polymer as a main constituent material are disposed respectively on opposite-side surfaces of the movable portions 264a and 264b. More specifically, as illustrated in FIGS. 7(A) and 7(B), the movable portion 264a is arranged on one side of the deformable layer 262, and the movable portion 264b is arranged on the other side of the deformable layer 262 opposite to the one side thereof on which the movable portion 264a is arranged.

Generally, an electrostrictive polymer has such a characteristic that, when a voltage (electric field) is applied, the electrostrictive polymer generates an electrostrictive action and contracts in the direction in which the voltage is applied. For example, when a voltage (electric field) is applied in the direction of thickness of a plate-like electrostrictive polymer, the electrostrictive polymer not only contracts in the direction of thickness thereof, but also spreads in the planar direction thereof regardless of the polarity of the applied voltage.

As illustrated in FIG. 6(B), therefore, when a voltage (electric field) is applied in the direction of thickness of the deformable layer 262, the deformable layer 262 (i.e., the movable portions 264a and 264b) is caused to spread in the planar direction. Thus, stress in the planar direction generates in the surface of the deformable layer 262 (i.e., the surfaces of the movable portions 264a and 264b).

On the other hand, respective surfaces of the restraint layers 266a and 266b on the side not in contact with the deformable layer 262 are in an electrically released state. Therefore, the voltage (electric field) is not applied in the direction of thickness of the restraint layers 266a and 266b. Thus, stress in the planar direction does not generate in those surfaces of the restraint layers 266a and 266b.

Stated another way, stress in the planar direction generates in the surface of the restraint layers 266a, which is in contact with the movable portion 264a, while no stress generates in a surface of the restraint layer 266a on the side opposite to the contact surface thereof with the movable portion 264a. As a result of unbalance between the stresses thus generated, the movable portion 264a is caused to bend toward the side including its contact surface with the restraint layer 266a.

Similarly, stress in the planar direction generates in the surface of the restraint layers 266b, which is in contact with the movable portion 264b, while no stress generates in a surface of the restraint layer 266b on the side opposite to the contact surface thereof with the movable portion 264b. As a result of unbalance between the stresses thus generated, the movable portion 264b is caused to bend toward the side including its contact surface with the restraint layer 266b.

By applying a predetermined AC voltage in the direction of thickness of the deformable layer 262 from the AC voltage source 208, each of the movable portions 264a and 264b repeats the deformation and the return to the original state. Consequently, looking at the entirety of the stationary element 260, it is cyclically deformed in the direction perpendicular to the lengthwise direction of the slit formed in the deformable layer 262 (i.e., in the up-and-down direction on the drawing sheets of FIGS. 6(A) and 6(B)). Further, by arranging the lengthwise direction of the slit formed in the deformable layer 262 to be aligned with the axial direction of the stationary element 260, the stationary element 260 can be caused to deform in the radial direction.

In the driven state, with the above-described deformation of the stationary element 260 in the radial direction, the pressure bearing portion 102 (see FIG. 4, etc.) generates the acting force in the axial direction, whereby the contracting operation between the movable elements 100 (see FIG. 4, etc.) is realized. On the other hand, in the not-driven state, the stationary element 260 maintains the original shape (with no deformation), and hence the sliding operation can be realized.

A manner of applying the voltage may also be practiced, instead of or in addition to a voltage applying circuit including the AC voltage source 208 which is illustrated in FIG. 6(B), by using the voltage applying circuit including the DC voltage source 259 and the switch unit SW, which is illustrated in FIG. 5.

Third Modification of Embodiment 1

Figure 8:
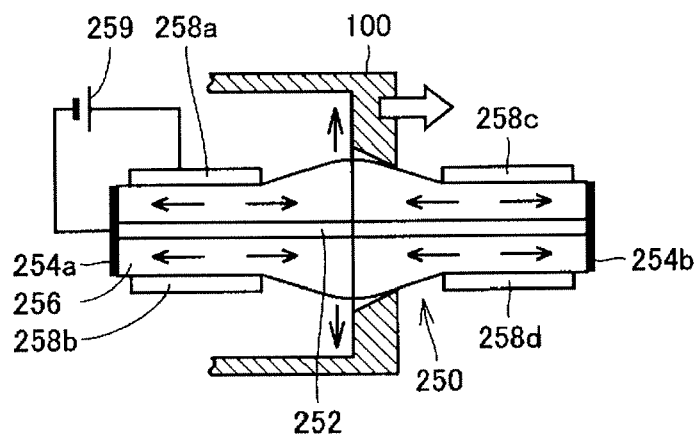
FIG. 8 is a schematic view illustrating the structure of a stationary element 250 according to a third modification of Embodiment 1 of the present invention.

FIG. 8 is a schematic view illustrating the structure of a stationary element 250 according to a third modification of Embodiment 1 of the present invention.

Referring to FIG. 8, the stationary element 250 according to this modification includes an electrically conductive core portion 252, and a clad portion 256 formed in a concentric form around the core portion 252. The clad portion 256 is made of, e.g., a piezoelectric member, an electrostrictive member, or a dielectric member, and it causes a displacement by receiving an internal electric field that is generated upon application of a voltage. The core portion 252 is made of, e.g., a polymer mixed with a metal or an electrically conductive filler. The piezoelectric member, the electrostrictive member, or the dielectric member, which is used to form the clad portion 256, is made of a ceramic, a polymer, or a composite (mixed) material of them.

Electrodes 254a and 254b electrically connected to the core portion 252 are formed respectively at opposite end surfaces of the clad portion 256 in the axial direction. The electrodes 254a and 254b serve also to restrict extension of the clad portion 256 in the axial direction. Further, electrodes 258a, 258b, 258c and 258d are formed on peripheral surfaces of the clad portion 256.

When the actuator is driven, a predetermined DC voltage is applied from a DC voltage source 259 between the electrodes 254a, 254b and the core portion 252 on one side and the electrodes 258a, 258b, 258c and 258d on the other side. As a result, the clad portion 256 causes a displacement based on a polarization action. Because the deformation of the clad portion 256 in the axial direction is restricted by the presence of the electrodes 254a and 254b, the caused displacement appears as a deformation in the radial direction.

In the driven state, with the above-described deformation of the stationary element 250 in the radial direction, the pressure bearing portion 102 generates the acting force in the axial direction, whereby the contracting operation between the movable elements 100 is realized. On the other hand, in the not-driven state, the stationary element 250 maintains the original shape (with no deformation), and hence the sliding operation can be realized.

Additionally, the displacement caused in each of the above-described stationary elements 200 and 250 may be generated about a center that is provided by the axis, or about a center that is provided by a position deviated from the axis, as in motions of a fish tail fin.

Advantages Obtained with Embodiment 1

According to Embodiment 1 of the present invention, when the actuator is driven, the stationary element causes a displacement at least in the radial direction such that the stationary element is relatively retracted into the corresponding movable elements, whereby the contracting operation is performed between the adjacent movable elements. When the actuator is not driven, the movable element and the stationary element can be moved relative to each other by receiving a slight force applied from the exterior. As a result, behaviors similar to operations of muscles of an organism can be realized.

Also, according to Embodiment 1 of the present invention, since a static frictional force between the movable element and the stationary element is small, a wear caused during the driving can be reduced. As a result, the life span of the actuator can be prolonged.

Embodiment 2

While Embodiment 1 has been described above, by way of example, in connection with the actuator in which a displacement is caused by utilizing strain generated based on the piezoelectric effect, the electrostrictive effect, the magnetostriction effect, the Maxwell force, etc., this embodiment will be described below in connection with an actuator in which a displacement is caused by generating an eccentric force with a rotating member.

Figure 9:
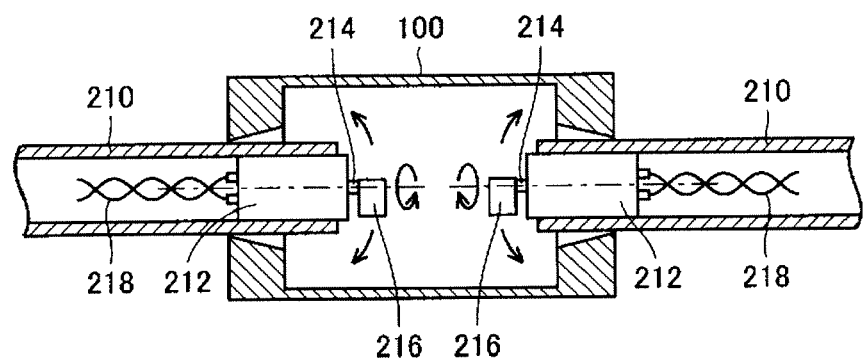
FIG. 9 is a schematic view illustrating the structure of an actuator according to Embodiment 2 of the present invention.

FIG. 9 is a schematic view illustrating the structure of an actuator according to Embodiment 2 of the present invention.

Referring to FIG. 9, the actuator according to this embodiment includes a movable element 100, which is similar to that in the above-described Embodiment 1, and a stationary element 210. The movable element 100 in the actuator according to this embodiment is similar to that in Embodiment 1, and hence a detailed description thereof is not repeated here.

The stationary element 210 includes rotating members 212 arranged at both sides thereof, and eccentrics 216 coupled to the rotating members 212 in eccentric relation to respective rotary shafts 214 of the rotating members 212. Each of the rotating members 212 is typically constituted by an electric-powered rotating device, such as a motor. When the actuator is driven, electric power is supplied to each rotating member 212 through wiring 218 from a power supply (not shown). When the rotating members 212 integral with the stationary elements 210 are rotated, the eccentrics 216 are also rotated together, thus generating eccentric forces in the radial direction with the rotations of the eccentrics 216. Further, the eccentric forces in the radial direction cause the stationary element 210 to deform in the radial direction at both opposite ends thereof.

Instead of the above-described arrangement in which the electric-powered rotating device is disposed with its rotary shaft in alignment with the center axis of the stationary element 210 and the eccentric is attached to the rotary shaft of the electric-powered rotating device, the eccentric force may be generated from the electric-powered rotating device itself by forming the stationary element so as to have an uneven sectional shape.

The other arrangement is similar to that in the above-described Embodiment 1, and hence a detailed description thereof is not repeated here.

Advantages Obtained with Embodiment 2

According to Embodiment 2 of the present invention, in addition to the advantages similar to those of the above-described Embodiment 1, a desired driving force can be realized by selecting an appropriate motor.

Embodiment 3

Embodiment 3 of the present invention will be described below in connection with an actuator that a displacement is generated by using a member, such as a shape memory alloy, of which shape is changed through martensitic transformation.

FIG. 10 is a schematic view illustrating the structure of an actuator according to Embodiment 3 of the present invention.

Referring to FIG. 10, the actuator according to this embodiment includes a movable element 100, which is similar to that in the above-described Embodiment 1, and a stationary element 220. The movable element 100 in the actuator according to this embodiment is similar to that in Embodiment 1, and hence a detailed description thereof is not repeated here. The stationary element 220 includes a displaceable portion 222 of which shape is changeable typically through martensitic transformation. The contracting operation of the actuator is realized in response to the displacement of the displaceable portion 222. A displacement speed of the displaceable portion 222 in this embodiment is slower than that in the above-described Embodiments 1 and 2.

FIGS. 11(A) to 11(C) are explanatory views to explain primary part of the actuator according to Embodiment 3 of the present invention.

Referring to FIGS. 11(A) and 11(B), the displaceable portion according to this embodiment is constituted by using a shape-memory alloy fiber 224 made of a Ti—Ni-based material. More specifically, the shape-memory alloy fiber 224 is given with a substantially linear shape as a memorized shape at high temperature. The shape-memory alloy fiber 224 is wound into a coiled form under room temperature, and the coiled shape-memory alloy fiber 224 is bound into a rather flattened bundle by a ring member 226 made of an elastic material, such as rubber.

When the thus-constituted displaceable portion 222 is heated, the shape-memory alloy fiber 224 tends to return to the linear shape, i.e., the memorized shape, and the rigidity of the displaceable portion 222 increases correspondingly. As a result, the shape-memory alloy fiber 224 is pressed to gradually spread in the radial direction against a binding force of the ring member 226.

The displaceable portion 222 according to this embodiment causes a displacement (deformation) in the radial direction by utilizing a force that is generated by the shape-memory alloy fiber 224 and that acts to press and spread the fiber 224 in the radial direction.

Referring to FIG. 11(C), in this embodiment, a current is supplied from a current source 228 to the shape-memory alloy fiber 224, and the shape-memory alloy fiber 224 is heated by utilizing Joule heat generated with the supplied current. Because the shape-memory alloy fiber 224 does not cause a deformation unless the transformation point is exceeded, a current supply capability of the current source 228 is appropriately designed in consideration of the transformation point of the shape-memory alloy fiber 224. In other words, a current value supplied from the current source 228 is designed such that the shape-memory alloy fiber 224 is subjected to a temperature change crossing the transformation point thereof.

Thus, in the actuator according to this embodiment, when the actuator is driven, the shape-memory alloy fiber 224 is heated so as to continuously generate the force acting to press and spread the fiber 224 in the radial direction such that the stationary element 220 is relatively retracted into the movable element 100. As a result, the distance between the movable elements 100 adjacent to each other is reduced and the contracting operation is realized. On the other hand, when the actuator is not driven, the rigidity of the shape-memory alloy fiber 224 is reduced by cooling thereof, and the shape-memory alloy fiber 224 is collapsed by the binding force of the ring member 226. As a result, the movable element 100 and the stationary element 220 can be freely moved relative to each other by receiving a slight force applied from the exterior.

As a manner of heating the shape-memory alloy fiber 224, instead of supplying a current from the current source 228 to the shape-memory alloy fiber 224 as described above, the shape-memory alloy fiber 224 may be directly or indirectly heated by using a heat source, which is disposed inside or outside the movable element 100.

Oscillation of the displacement can be produced by cyclically varying the temperature.

First Modification of Embodiment 3

Figure 12A:
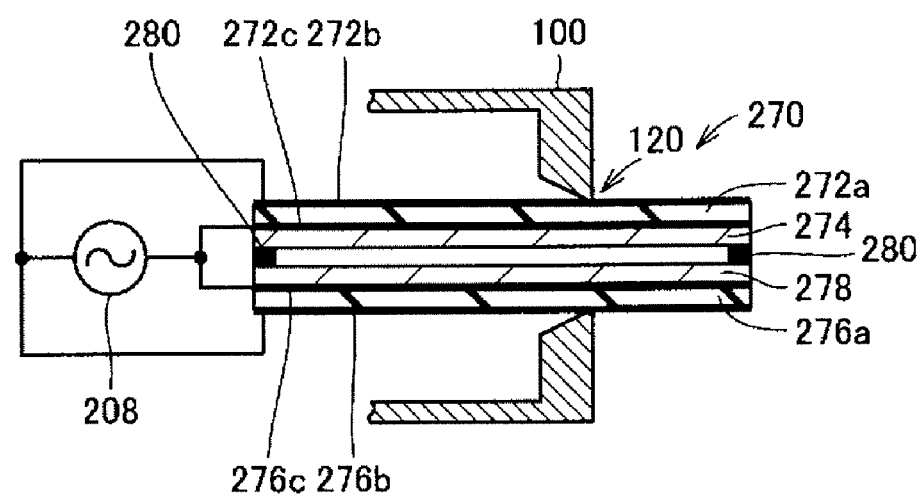
FIGS. 12(A) and 12(B) are schematic views illustrating the structure of a stationary element 270 according to a first modification of Embodiment 3 of the present invention.
Figure 12B:
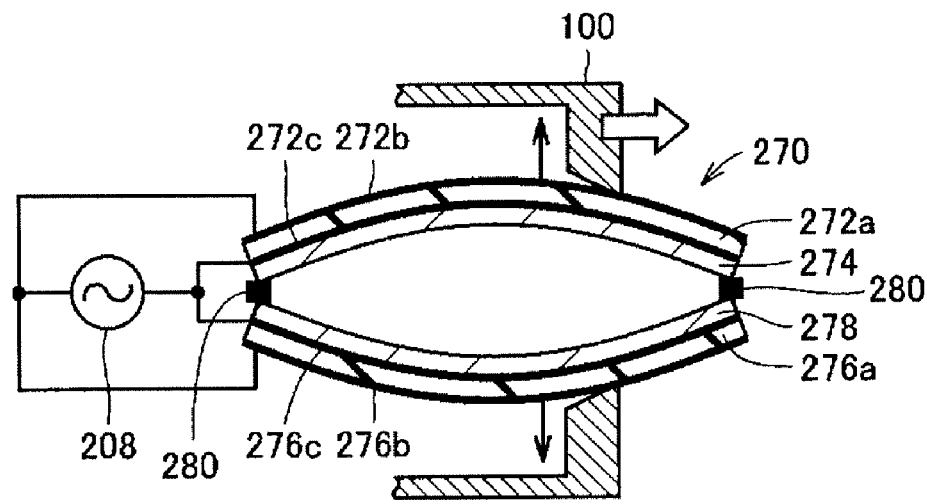

FIGS. 12(A) and 12(B) are schematic views illustrating the structure of a stationary element 270 according to a first modification of Embodiment 3 of the present invention.

Referring to FIG. 12(A), the stationary element 270 according to this modification constitutes a unimorph actuator and includes a pair of electrostrictive polymers in a multilayer form. More specifically, the stationary element 270 includes a deformable layer 272a made of an electrostrictive polymer as a main constituent material, and a restraint layer 274. The deformable layer 272a and the restraint layer 274 are laminated into an integral form. Further, the stationary element 270 includes a deformable layer 276a and a restraint layer 278, which are similarly laminated into an integral form. Those multilayer electrostrictive polymers are coupled to each other at their both ends in the lengthwise direction with two spacers 280 interposed therebetween. The deformable layers 272a and 272b may be each formed by laminating a single layer made of the electrostrictive polymer in plural number one above another.

A pair of electrodes 272b and 272c for applying a voltage (electric field) in the direction of thickness of the deformable layer 272a are disposed respectively on both sides of the deformable layer 272a to extend parallel to its surface at which the deformable layer 272a is laminated. On the other hand, one surface of the restraint layer 274 is in contact with the electrode 272c, while the other opposite surface of the restraint layer 274 is in an electrically released state. Similarly, a pair of electrodes 276b and 276c for applying a voltage (electric field) in the direction of thickness of the deformable layer 276a are disposed respectively on both sides of the deformable layer 276a to extend parallel to its surface at which the deformable layer 276a is laminated. On the other hand, one surface of the restraint layer 278 is in contact with the electrode 276c, while the other opposite surface of the restraint layer 278 is in an electrically released state.

As described above, when a voltage (electric field) is applied to a plate-like electrostrictive polymer in the direction of thickness thereof, the electrostrictive polymer contracts in the direction of thickness thereof and spreads in the planar direction thereof regardless of the polarity of the applied voltage.

When a voltage is applied between respective ends of the electrode 272b and the electrode 272c, the voltage (electric field) is applied in the direction of thickness of the deformable layer 272a. As a result, the deformable layer 272a spreads in the planar direction. Thus, stress in the planar direction generates in the surface of the deformable layer 272a. On the other hand, because the voltage (electric field) is not applied to the restraint layer 274, stress in the planar direction does not generate in the surface of the restraint layer 274.

Stated another way, stress in the planar direction generates in the one surface of the restraint layers 274, which contacts with the deformable layer 272a (i.e., the electrode 272c), while no stress generates in the other surface of the restraint layer 274 on the side opposite to the contact surface thereof with the deformable layer 272a. As a result of unbalance between the stresses thus generated, the deformable layer 272a and the restraint layer 274 are caused to bend upward as viewed on the drawing sheet (see FIG. 12(B)).

Similarly, when a voltage is applied between respective ends of the electrode 276b and the electrode 276c, stress in the planar direction generates in the one surface of the restraint layers 278, which contacts with the deformable layer 276a (i.e., the electrode 276c), while no stress generates in the other surface of the restraint layer 278 on the side opposite to the contact surface thereof with the deformable layer 276a. As a result of unbalance between the stresses thus generated, the deformable layer 276a and the restraint layer 278 are caused to bend downward as viewed on the drawing sheet (see FIG. 12(B)).

By applying a predetermined AC voltage in the direction of thickness of the deformable layers 272a and 276a from the AC voltage source 208, each of the multilayer electrostrictive polymers repeats the deformation and the return to the original state. Consequently, looking at the entirety of the stationary element 270, it is cyclically deformed in the radial direction (i.e., in the up-and-down direction of FIGS. 12(A) and 12(B)). Further, by arranging the lengthwise direction of the slit formed in the deformable layer 262 to be aligned with the axial direction of the stationary element 260, the stationary element 260 can be caused to deform in the radial direction.

In the driven state, with the above-described deformation of the stationary element 270 in the radial direction, the pressure bearing portion 102 generates the acting force in the axial direction, whereby the contracting operation between the movable elements 100 is realized. On the other hand, in the not-driven state, the stationary element 270 maintains the original shape (with no deformation), and hence the sliding operation can be realized.

A manner of applying the voltage may also be practiced, instead of or in addition to a voltage applying circuit including the AC voltage source 208 which is illustrated in FIGS. 12(A) and 12(B), by using the voltage applying circuit including the DC voltage source 259 and the switch unit SW, which is illustrated in FIG. 5.

Oscillation of the displacement can be produced by cyclically varying the voltage.

Second Modification of Embodiment 3

While the contraction of the movable element 100 can be realized with expansion of the entire displaceable portion 222 as illustrated in FIGS. 11(A) to 11(C) described above, it is more preferable that a part of the movable element 100 contacting with the pressure bearing portion 102 expands to a larger extent. In view of that point, a speed and an amount of contraction of the movable element 100 can be further increased by employing a displaceable portion having such a shape as illustrated in FIGS. 13(A) to 13(C).

Figure 13A:
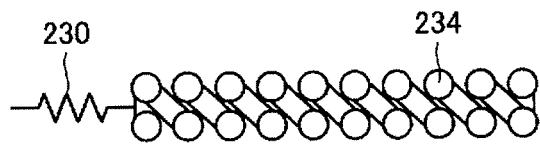
FIGS. 13(A) to 13(C) are explanatory views to explain primary part of an actuator according to a second modification of Embodiment 3 of the present invention.
Figure 13B:
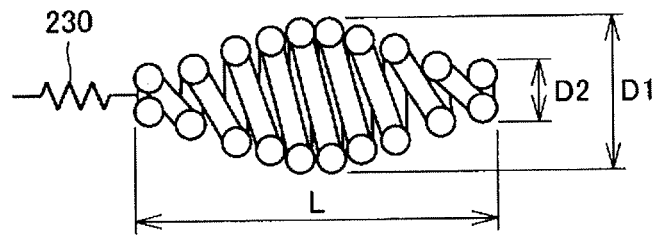
Figure 13C:
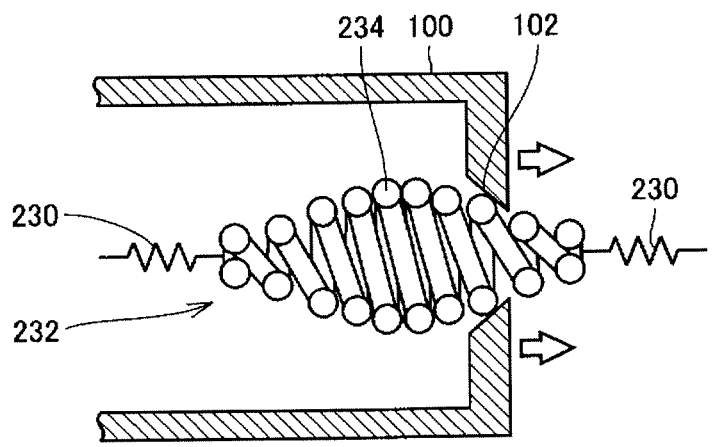

FIGS. 13(A) to 13(C) are explanatory views to explain primary part of an actuator according to a second modification of Embodiment 3 of the present invention.

Referring to FIGS. 13(A) and 13(B), a movable element according to this modification includes a displaceable portion 234 made of a shape memory alloy. More specifically, the displaceable portion 234 is formed by winding the shape memory alloy into a spiral form. A shape bulging in its central portion, illustrated in FIG. 13(B), is previously memorized in the displaceable portion 234. Further, the displaceable portion 234 is connected to another adjacent displaceable portion 234 (not shown) through a spring member 230. Due to a tensile force applied from the spring member 230, the bulging central portion of the displaceable portion 234 is flattened at room temperature such that the displaceable portion 234 has a substantially columnar shape.

When the displaceable portion 234 is heated by using a current source (not shown), the displaceable portion 234 generates a restoration force causing the displaceable portion 234 to return to the shape illustrated in FIG. 13(B). By arranging the displaceable portion 234 to be held in contact with the pressure bearing portion 102 of the movable element 100 as illustrated in FIG. 13(C), the restoration force acts upon the pressure bearing portion 102. As a result, the acting force in the axial direction is generated such that the stationary element is relatively retracted into the movable element 100.

Thus, in the actuator according to this embodiment, when the actuator is driven, the displaceable portion 234 is heated so as to continuously generate the force acting to press and spread the displaceable portion 234 in the radial direction such that the stationary element is relatively retracted into the movable element 100. As a result, the distance between the movable elements 100 adjacent to each other is reduced and the contracting operation is realized. On the other hand, when the actuator is not driven, the rigidity of the displaceable portion 234 is reduced by cooling thereof, and the displaceable portion 234 is collapsed by the tensile force of the spring member 230. As a result, the movable element 100 and the stationary element can be freely moved relative to each other by receiving a slight force applied from the exterior.

Oscillation of the displacement can be produced by cyclically varying the temperature.

The other arrangement is similar to that in the above-described Embodiment 1, and hence a detailed description thereof is not repeated here.

Advantages Obtained with Embodiment 3

According to Embodiment 3 of the present invention, in addition to the advantages similar to those of the above-described Embodiment 1, the following advantage is obtained. Since the generation of the displacement takes a longer time, the actuator can be provided which is more suitable for an application requiring the displacement to be more slowly generated.

Embodiment 4

Embodiment 4 of the present invention will be described below in connection with an actuator in which a displacement is generated by utilizing a volume change caused due to phase transition.

Figure 14:
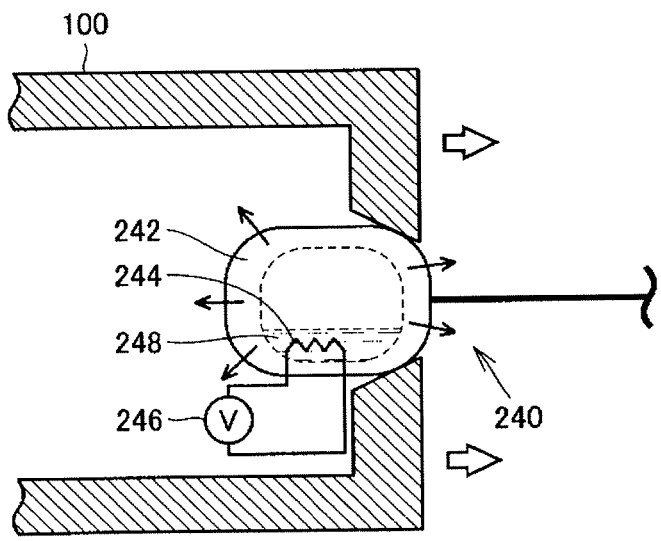
FIG. 14 is a schematic view illustrating the structure of an actuator according to Embodiment 4 of the present invention.

FIG. 14 is a schematic view illustrating the structure of an actuator according to Embodiment 4 of the present invention.

Referring to FIG. 14, the actuator according to this embodiment includes a movable element 100, which is similar to that in the above-described Embodiment 1, and a stationary element 240. The movable element 100 in the actuator according to this embodiment is similar to that in Embodiment 1, and hence a detailed description thereof is not repeated here.

The stationary element 240 includes an expanding and contracting portion 242 capable of changing its outer shape at least in the radial direction depending on an internal pressure within the expanding and contracting portion 242, and a medium 248 that is enclosed (charged) in the expanding and contracting portion 242 and that changes its volume due to phase transition. The expanding and contracting portion 242 is typically formed of a bag-like member made of an elastic material, such as rubber. Preferably, the medium 248 is typically provided as a substance, e.g., water, which maintains liquid phase at room temperature.

Further, the stationary element 240 includes a heater unit 244 disposed in the expanding and contracting portion 242 to heat the medium 248, and a power supply unit 246 for supplying a current to the heater unit 244.

When a current is supplied to the heater unit 244 within the above-described stationary element 240 from the power supply unit 246 to heat the medium 248 to its boiling point, the medium 248 is caused to transit from the liquid phase to the gaseous phase. As a result, the internal pressure within the expanding and contracting portion 242 rises so that the outer shape of the expanding and contracting portion 242 expands. Stated another way, the expanding and contracting portion 242 gradually spreads in the radial direction.

In the stationary element 240 according to this embodiment, a displacement (deformation) in the radial direction is caused by utilizing the force generated by the expanding and contracting portion 242 and acting to press and spread the same in the radial direction. Because the medium 248 does not cause the phase transition unless the transition temperature (i.e., the boiling point in this case) is exceeded, a power supply capability of the power supply unit 246 is appropriately designed in consideration of the transition temperature of the medium 248. In other words, the power supply capability of the power supply unit 246 is designed such that the medium 248 is subjected to a temperature change crossing the transition temperature thereof.

Thus, in the actuator according to this embodiment, when the actuator is driven, the medium 248 is heated to cause the phase transition such that the expanding and contracting portion 242 generates the force acting to press and spread the same in the radial direction. With the force acting to press and spread the expanding and contracting portion 242 in the radial direction, the stationary element 240 is relatively retracted into the movable element 100. As a result, the distance between the movable elements 100 adjacent to each other is reduced and the contracting operation is realized. On the other hand, when the actuator is not driven, heat is radiated to the exterior from the expanding and contracting portion 242. Therefore, the medium 248 is cooled and returns to a liquid, whereby the expanding and contracting portion 242 contracts. As a result, the movable element 100 and the stationary element 240 can be freely moved relative to each other by receiving a slight force applied from the exterior.

Oscillation of the displacement can be produced by cyclically varying the temperature.

Advantages Obtained with Embodiment 4

According to Embodiment 4 of the present invention, in addition to the advantages similar to those of the above-described Embodiment 1, the following advantage is obtained. Since the generation of the displacement takes a longer time, the actuator can be provided which is more suitable for an application requiring the displacement to be more slowly generated.

Embodiment 5

Embodiments 1 to 4 have been described above in connection with the arrangements that, when the actuator is not driven, the movable element and the stationary element can be freely moved relative to each other by receiving a slight force applied from the exterior. This embodiment will be described below, by way of example, in connection with a structure enabling the movable element and the stationary element to be freely moved relative to each other when the actuator is not driven.

Figure 15:
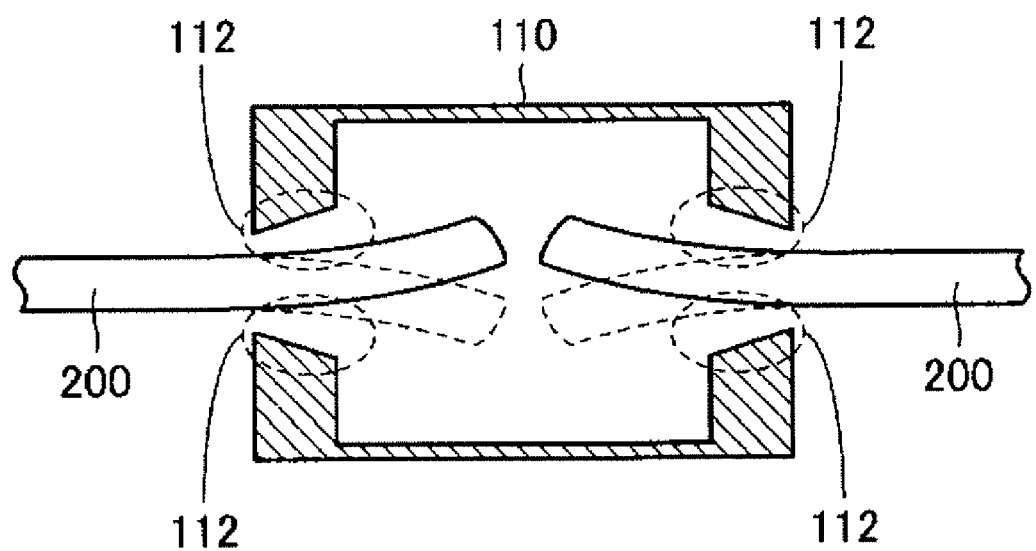
FIG. 15 illustrates the relationship in size between a movable element and a stationary element in an actuator according to Embodiment 5 of the present invention.

FIG. 15 illustrates a contact structure between a movable element and a stationary element in an actuator according to Embodiment 5 of the present invention.

Referring to FIG. 15, in the actuator according to this embodiment, a hole having a larger area in cross-sectional shape than that of the stationary element 200 is formed in the movable element 110. More specifically, a predetermined clearance 112 is left between the movable element 110 and the stationary element 200. In the not-driven state where the stationary element 200 does not cause the displacement in the radial direction, therefore, a frictional force (stress) generated between the movable element 110 and the stationary element 200 becomes relatively smaller when both the elements are moved relative to each other.

Assuming, as an example, that, in the actuator (FIG. 9) according to Embodiment 2, the stationary element 200 is formed of a silicon tube having an outer diameter of 6 mm and the movable element 110 is formed of a plastic (typically Duracon) having an outer diameter of 10 mm and an inner diameter of 6 mm, a driving force developed between both the elements in the driven state is about 0.2 N.

Therefore, the clearance 112 between the stationary element 200 and the movable element 110 is preferably designed such that the frictional force between both the elements becomes smaller than the driving force of 0.2 N in the not-driven state.

Oscillation of the displacement can be produced by cyclically varying the driving force.

Modification of Embodiment 5

Alternatively, instead of leaving the clearance between the stationary element and the movable element, a support capable for relatively reducing the frictional force between the stationary element and the movable element through point contact or line contact may be interposed between both the elements.

Figure 16:
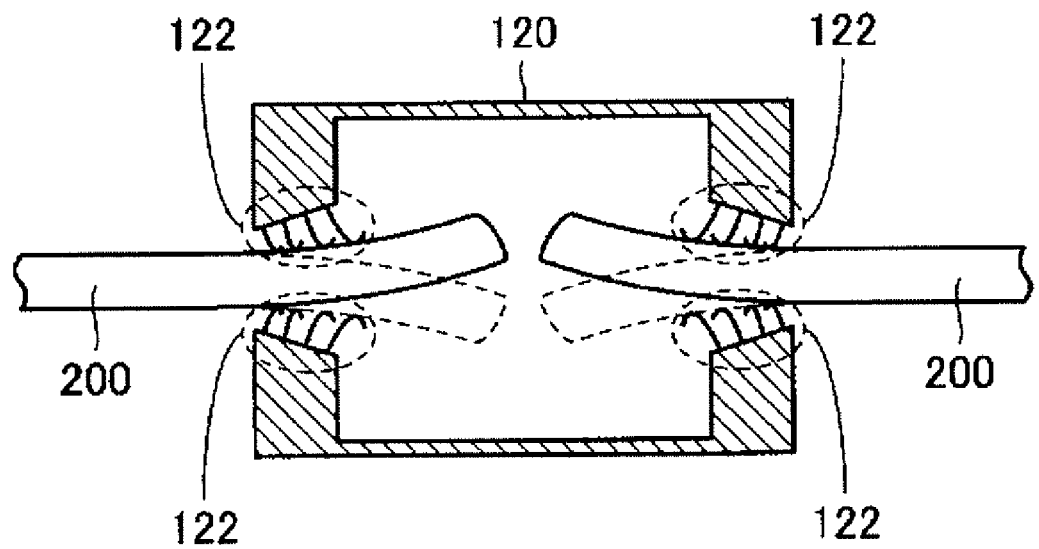
FIG. 16 illustrates the relationship in size between a movable element and a stationary element in an actuator according to a modification of Embodiment 5 of the present invention.

FIG. 16 illustrates a contact structure between a movable element and a stationary element in an actuator according to a modification of Embodiment 5 of the present invention.

Referring to FIG. 16, in the actuator according to this modification, projections 122 are disposed between a movable element 120 and a stationary element 200 to support both the elements through point contact or line contact. The projections 122 are each formed of a linear member made of a resin or a metal.

Because the projections 122 are elastically deformed in response to stress applied from the exterior, the shape of each projection 122 can be changed by a slight force depending on the movement of the stationary element 200. Hence, the frictional force required for relatively moving the movable element 110 and the stationary element 200 in the not-driven state can be reduced.

As an alternative, the projection may be formed by using a film-like member instead of the linear member illustrated in FIG. 16.

Embodiment 6

When the actuator according to the present invention is applied to the above-described mechanism illustrated in FIGS. 1(A) to 1(C), the stationary element is required, for the purpose of realizing a necessary amount of movement (displacement), to be relatively retracted into the movable element in a length corresponding to the necessary amount of movement. Stated another way, it is required that the movable element is constituted to be able to accommodate a necessary portion of the entire length of the stationary element.

Also, the displacement of the movable element is not always linear depending on a characteristic that is required for a mechanism to which the actuator according to the present invention is applied. For that reason, the stationary element is preferably constituted to be given with flexibility as the occasion requires.

FIGS. 17(A) and 17(B) illustrate one example of an arrangement in which basic units of an actuator according to Embodiment 6 of the present invention are connected in series. With reference to FIGS. 17(A) and 17(B), this embodiment will be described below, by way of example, in connection with the case of using an actuator including a stationary element 210 that is similar to the actuator according to Embodiment 2 illustrated in FIGS. 2(A) and 2(B).

Referring to FIG. 17(A), holes allowing the stationary elements 210 to move relatively are formed at both ends of each movable element 130. When the actuator is driven, each of the stationary elements 210 causes a displacement such that respective ends of the stationary elements 210 are relatively retracted into the corresponding movable elements 130.

On that occasion, as viewed from each movable element 130, the stationary elements 210 positioned at both ends of the movable element 130 relatively come into the movable element 130. As a result, the distance between the movable elements 130 adjacent to each other is reduced. At that time, if the movable element 130 has a linear shape, the stationary elements 210 positioned at both the ends are caused to move toward a center of the movable element 130 on substantially the same axis. Depending on mechanisms to which the actuator is applied, however, the movable elements 130 positioned at both the ends are caused not to move on substantially the same axis by receiving external forces. In such a case, the stationary elements 210 is preferably made of a resin, for example, such that the stationary elements 210 has flexibility (elasticity) to be adaptable for the external forces.

On the other hand, the sliding operation in the not-driven state is required not to impede the extending operation between the stationary element 210 and the movable element 130. In other words, the movable element 130 is required to be flexible in the bending direction, but to have a predetermined degree of rigidity in the extending direction.

In consideration of such a demand, the movable element 130 can be constituted, as illustrated in FIG. 17(B), by forming slits 132 in its outer wall such that the movable element 130 is flexible in the bending direction due to a reduction of rigidity in the bending direction while it has sufficient rigidity in the extending direction.

As an alternative, reinforcing fibers may be mixed in the movable element 130 to be oriented in a predetermined direction such that the movable element 130 has anisotropy depending on the oriented direction.

Advantages Obtained with Embodiment 6

According to Embodiment 6 of the present invention, the driving force can be developed in an appropriate direction depending on a mechanism (application) to which the actuator is applied.

Embodiment 7

When the actuator according to the present invention is applied to the above-described mechanism illustrated in FIGS. 1(A) to 1(C), the actuator needs to be protected even when any external force is imposed on any of the basic units of the actuator. Embodiment 7 of the present invention will be described below, by way of example, in connection with a structure for restricting, as one practice of the protective function, relative movement between the stationary element and the movable element within a predetermined range.

Figure 18:
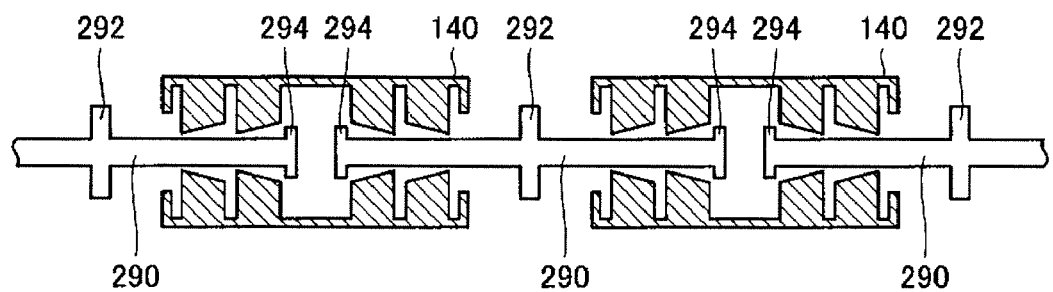
FIG. 18 is a sectional view illustrating primary part of an actuator according to Embodiment 7 of the present invention.

FIG. 18 is a sectional view illustrating primary part of an actuator according to Embodiment 7 of the present invention.

Referring to FIG. 18, in the actuator according to this embodiment, a stationary element 290 is provided with stopper portions 292 and 294 for restricting relative movement between the stationary element 290 and a movable element 140.

More specifically, the stopper portion 292 formed at a center of each stationary element 290 (i.e., at a midpoint between the movable elements 140 adjacent to each other) serves as an excessive insertion preventive stopper for preventing interference between the stationary elements 290 adjacent to each other within the movable element 140. In the contracting operation when the actuator is driven, the stationary elements 290 are relatively retracted into each movable element 140 from the both sides thereof. Accordingly, the adjacent stationary elements 290 within the movable element 140 may interfere with each other unless any restriction is provided to avoid the interference between the adjacent stationary elements 290. In consideration of such a point, the stopper portion 292 having a cross-sectional shape in a larger size than that of the hole in the movable element 140 is formed on the stationary element 290 to prevent the interference between the adjacent stationary elements 290.

Further, the stopper portions 294 formed at both ends of each stationary element 290 serve as slip-out preventive stoppers for preventing the stationary element 290 from slipping out from the movable element 140. More specifically, in the sliding operation when the actuator is not driven, because the frictional force generated between the movable element 140 and the stationary elements 290 is very small, the stationary element 290 tends to slip out from the movable element 140 even in the case of receiving a slight external force. In consideration of such a point, the stoppers 294 each having a cross-sectional shape in a larger size than that of the pressure bearing portion of the movable element 140 are formed to prevent the stationary element 290 from slipping out.

When the actuator is formed by inserting a ring-shaped pressure bearing portion into the movable element 140, there is a risk that the pressure bearing portion may itself slip out. It is hence preferable that projections are provided at both the ends of the movable element 140 to prevent the pressure bearing portion from slipping out.

Advantages Obtained with Embodiment 7

According to Embodiment 7 of the present invention, the actuator can be protected regardless of the extending and contracting characteristics required for a mechanism (application) to which the present invention is applied. As a result, ruggedness of the actuator can be increased.

Embodiment 8

While Embodiments 1 to 7 have been described above, by way of example, in connection with the arrangement in which the stationary element is relatively retracted into the movable element, the movable element may be relatively retracted into the stationary element.

Figure 19:
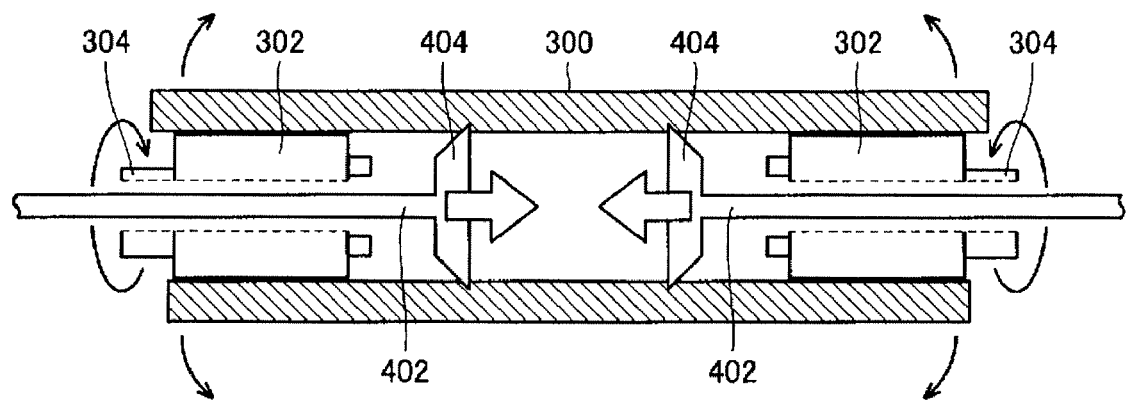
FIG. 19 is a sectional view illustrating primary part of an actuator according to Embodiment 8 of the present invention.

FIG. 19 is a sectional view illustrating primary part of an actuator according to Embodiment 8 of the present invention.

Referring to FIG. 19, the actuator according to this embodiment is constituted by mutually exchanging the respective functions of the stationary element and the movable element in the actuator according to Embodiment 2 illustrated in FIG. 9. More specifically, the actuator according to this embodiment includes a movable element 402 and a stationary element 300.

The stationary element 300 includes rotating members 302 arranged at both sides thereof, and eccentrics 304 coupled to the rotating members 302 in eccentric relation to respective axes of rotation thereof. Each of the rotating members 302 is typically constituted by an electric-powered rotating device, such as a motor. When the actuator is driven, each rotating member 302 is rotated with electric power supplied from a power supply (not shown). When the rotating members 302 integral with the stationary element 300 are rotated, the eccentrics 304 are also rotated together, thus generating eccentric forces in the radial direction with the rotations of the eccentrics 304. Further, the eccentric forces in the radial direction cause the stationary element 300 to deform in the radial direction at both opposite ends thereof.

On the other hand, the movable element 402 is constituted to be freely rotatable while penetrating through the rotating member 302 which has a hollow structure. Pressure bearing portions 404 each having an uneven size in the radial direction (i.e., an uneven radius) along the axial direction are formed at both ends of the movable element 402. When the actuator is driven, the pressure bearing portion 404 receives (bears) a displacement generated by the stationary element 300 at least in the radial direction and imposes an acting force upon the stationary element 300 and the movable element 402 so as to relatively move both the elements along the axial direction in a predetermined orientation (i.e., an orientation in which the stationary elements 300 come closer to each other).

The other arrangement is similar to that in the above-described Embodiment 2, and hence a detailed description thereof is not repeated here.

For the sake of convenience in explanation, Embodiment 8 has been described above, by way of example, in connection with the case of mutually exchanging the respective functions of the stationary element and the movable element in the actuator according to Embodiment 2 illustrated in FIG. 9. In the other embodiments, however, the positional relationship between the stationary element and the movable element can also be similarly exchanged.

Advantages Obtained with Embodiment 8

According to Embodiment 8 of the present invention, since the structure of the stationary element can be simplified, an actuator having a large amount of extension and contraction, for example, can be realized with ease.

It is to be construed that the embodiments disclosed above are merely exemplary of the present invention in all points and are not given herein with intent to limit the present invention. The scope of the present invention is defined in claims without being restricted by the foregoing description and is to involve not only all equivalent meanings of the matters stated in the claims, but also all changes within the scope defined in the claims.

The invention claimed is:

1. An actuator comprising:
a stationary element and a movable element, the stationary element and the movable element being relatively movable along a predetermined axis of movement when the actuator is not driven, wherein
the stationary element includes a displaceable portion that causes a displacement at least in a radial direction when the actuator is driven,
the movable element includes a pressure bearing portion that imposes an acting force in one direction along the axis of movement in response to the displacement caused by the displaceable portion of the stationary element, and
the acting force generated by the pressure bearing portion when the actuator is driven is larger than a force required to move the stationary element and the movable element relative to each other when the actuator is not driven.

2. The actuator according to claim 1, wherein the pressure bearing portion generates a component force in the one direction along the axis of movement by receiving pressure in the radial direction, which pressure is generated due to the displacement caused by the displaceable portion.

3. The actuator according to claim 1, wherein the pressure bearing portion has a surface positioned away from the axis of movement by a predetermined distance, and
a distance between the axis of movement and the surface of the pressure bearing portion in a direction perpendicular to the axis of movement gradually changes along an axial direction.

4. The actuator according to claim 3, wherein the distance between the axis of movement and the surface of the pressure bearing portion in the direction perpendicular to the axis of movement gradually increases along the axial direction.

5. The actuator according to claim 3, wherein the distance between the axis of movement and the surface of the pressure bearing portion in the direction perpendicular to the axis of movement gradually decreases along the axial direction.

6. The actuator according to claim 1, wherein the stationary element and the movable element are spaced from each other by a predetermined clearance.

7. The actuator according to claim 1, wherein a support member is disposed between the stationary element and the movable element.

8. The actuator according to claim 1, wherein the support is configured to provide at least one of point contact and line contact between the stationary element and the movable element.

9. The actuator according to claim 1, wherein the displaceable portion includes, as a source for generating the displacement, a strainable member which generates strain based on at least one of a piezoelectric effect, an electrostrictive effect, a magnetostriction effect, and a Maxwell force upon application of a voltage when the actuator is driven.

10. The actuator according to claim 1, wherein the displaceable portion includes:
   a rotating member which is rotated when the actuator is driven; and
   an eccentric coupled to the rotating member in eccentric relation to a rotary shaft of the rotating member, and
   wherein a deformation developed by an eccentric force that is generated with the rotation of the rotating member causes the displacement.

11. The actuator according to claim 1, wherein the displaceable portion includes:
   a shape changeable member configured to change a shape thereof at least in the radial direction through martensitic transformation; and
   a temperature change generator that provides the shape changeable member with a temperature change crossing a transformation point of the shape changeable member.

12. The actuator according to claim 1, wherein the displaceable portion includes:
   an expanding and contracting portion capable of changing an outer shape thereof at least in the radial direction depending on an internal pressure;
   a medium enclosed in the expanding and contracting portion and changing a volume thereof due to phase transition; and
   a temperature change generator that provides the medium with a temperature change crossing a transition point of the medium.

13. The actuator according to claim 1, wherein the movable element is flexible.

14. The actuator according to claim 1, wherein at least one of the stationary element and the movable element further includes a restriction portion operable to restrict relative movement between the stationary element and the movable element.

15. The actuator according to claim 1, further comprising a variation generator that cyclically varies voltage or temperature applied to a displaceable member of the displaceable portion.

16. An actuator comprising:
   a stationary element and a movable element, the stationary element and the movable element being relatively movable along a predetermined axis of movement when the actuator is not driven, wherein
   the movable element includes a displaceable portion that causes a displacement at least in a radial direction when the actuator is driven,
   the stationary element includes a pressure bearing portion that imposes an acting force in one direction along the axis of movement in response to the displacement caused by the displaceable portion of the movable element, and
   the acting force generated by the pressure bearing portion when the actuator is driven is larger than a force required to move the stationary element and the movable element relative to each other when the actuator is not driven.

17. The actuator according to claim 16, further comprising a variation generator that cyclically varies voltage or temperature applied to a displaceable member of the displaceable portion.

* * * * *